US012402434B2

(12) United States Patent
Otsuka

(10) Patent No.: US 12,402,434 B2
(45) Date of Patent: Aug. 26, 2025

(54) SOLAR CELL AND SOLAR CELL MODULE

(71) Applicant: SHIN-ETSU CHEMICAL CO., LTD., Tokyo (JP)

(72) Inventor: Hiroyuki Otsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/791,208

(22) Filed: Feb. 14, 2020

(65) Prior Publication Data
US 2020/0185552 A1 Jun. 11, 2020

Related U.S. Application Data

(63) Continuation of application No. 16/731,132, filed on Dec. 31, 2019, now abandoned, which is a (Continued)

(30) Foreign Application Priority Data

Nov. 13, 2014 (JP) .................... 2014-230517

(51) Int. Cl.
*H10F 77/20* (2025.01)
*H10F 10/14* (2025.01)
(Continued)

(52) U.S. Cl.
CPC ........... *H10F 77/219* (2025.01); *H10F 10/14* (2025.01); *H10F 71/00* (2025.01);
(Continued)

(58) Field of Classification Search
CPC .................. H01L 31/00; H01L 31/02; H01L 31/02008; H01L 31/0201; H01L 31/0224;
(Continued)

(56) References Cited

U.S. PATENT DOCUMENTS

| | | |
|---|---|---|
| 6,815,605 B1 | 11/2004 | Abe et al. |
| 2005/0252544 A1 | 11/2005 | Rohatgi et al. |
| 2006/0060238 A1 | 3/2006 | Hacke et al. |
| 2009/0020156 A1 | 1/2009 | Ohtsuka et al. |

(Continued)

FOREIGN PATENT DOCUMENTS

| | | |
|---|---|---|
| CN | 101164173 A | 4/2008 |
| CN | 101399297 A | 4/2009 |

(Continued)

OTHER PUBLICATIONS

Apr. 11, 2017 Office Action issued in Japanaese Patent Application No. 2014-230517.

(Continued)

*Primary Examiner* — Christina Chern
(74) *Attorney, Agent, or Firm* — Oliff PLC

(57) ABSTRACT

A solar cell having a P-type silicon substrate where one main surface is a light-receiving surface and another is a backside, a plurality of back surface electrodes formed on a part of the backside, an N-type layer in at least a part of the light-receiving surface, and contact areas in which the substrate contacts the electrodes. The P-type silicon substrate is a silicon substrate doped with gallium and has a resistivity of 2.5 Ω·cm or less; and a back surface electrode pitch $P_{rm}$ [mm] of contact areas in which the P-type silicon substrate is in contact with the back surface electrodes and the resistivity $R_{sub}$ [Ω·cm] of the substrate satisfy the relation represented by the following formula (1).

$$\log(R_{sub}) \leq -\log(P_{rm}) + 1.0 \qquad (1)$$

31 Claims, 4 Drawing Sheets

Related U.S. Application Data continuation of application No. 16/273,497, filed on Feb. 12, 2019, which is a continuation of application No. 15/523,923, filed as application No. PCT/JP2015/005190 on Oct. 14, 2015, now abandoned.

(51) Int. Cl.
*H10F 71/00* (2025.01)
*H10F 77/1223* (2025.01)
*H10F 77/166* (2025.01)
*H10F 77/30* (2025.01)

(52) U.S. Cl.
CPC ..... *H10F 77/1223* (2025.01); *H10F 77/1668* (2025.01); *H10F 77/211* (2025.01); *H10F 77/311* (2025.01); *Y02E 10/50* (2013.01); *Y02E 10/547* (2013.01)

(58) Field of Classification Search
CPC ......... H01L 31/022425; H01L 31/0248; H01L 31/0256; H01L 31/028; H01L 31/0288; H01L 31/068
See application file for complete search history.

(56) References Cited

U.S. PATENT DOCUMENTS

| | | | |
|---|---|---|---|
| 2009/0020158 A1 | 1/2009 | Ohtsuka et al. | |
| 2009/0025786 A1 | 1/2009 | Rohatgi et al. | |
| 2010/0108139 A1 | 5/2010 | Li | |
| 2011/0056554 A1 | 3/2011 | Yamamoto et al. | |
| 2011/0120551 A1* | 5/2011 | Prince | B22F 1/0059 136/256 |
| 2011/0197964 A1* | 8/2011 | Jang | H01L 31/068 136/256 |
| 2012/0037224 A1 | 2/2012 | Fujikawa et al. | |
| 2012/0325291 A1 | 12/2012 | Yokosawa et al. | |
| 2013/0183795 A1* | 7/2013 | Akimoto | H01B 1/22 257/E31.124 |
| 2013/0247957 A1 | 9/2013 | Hashigami et al. | |
| 2013/0247980 A1 | 9/2013 | Yokosawa et al. | |
| 2014/0034123 A1 | 2/2014 | Bitnar et al. | |
| 2014/0102527 A1 | 4/2014 | Ogane et al. | |
| 2015/0179837 A1 | 6/2015 | Cheong et al. | |

FOREIGN PATENT DOCUMENTS

| | | | |
|---|---|---|---|
| CN | 101694008 A | 4/2010 | |
| CN | 102414833 A | 4/2012 | |
| CN | 102742025 A | 10/2012 | |
| CN | 103299432 A | 9/2013 | |
| CN | 103329280 A | 9/2013 | |
| CN | 103608933 A | 2/2014 | |
| JP | 2002-047095 A | 2/2002 | |
| JP | 2002-076400 A | 3/2002 | |
| JP | 2002-083983 A | 3/2002 | |
| JP | 2002-104898 A | 4/2002 | |
| JP | 2004-006565 A | 1/2004 | |
| JP | 2004-064028 A | 2/2004 | |
| JP | 2004-095674 A | 3/2004 | |
| JP | 2004-140024 A | 5/2004 | |
| JP | 2006-310368 A | 11/2006 | |
| JP | 2013-048126 A | 3/2013 | |
| JP | 2013-512571 A | 4/2013 | |
| JP | 2013-135155 A | 7/2013 | |
| KR | 20040045387 A | 6/2004 | |
| TW | 200703699 A | 1/2007 | |
| WO | 00/73542 A1 | 12/2000 | |
| WO | 02/31892 A1 | 4/2002 | |

OTHER PUBLICATIONS

Dec. 15, 2015 International Search Report issued in International Patent Application No. PCT/JP2015/005190.
May 16, 2017 International Preliminary Report on Patentability issued in International Patent Application No. PCT/JP2015/005190.
Jun. 13, 2017 Office Action issued in Japanese Patent Application No. 2014-230517.
Mar. 27, 2018 Extended European Search Report issued in European Patent Application No. 15858822.8.
Jul. 3, 2018 Office Action issued in Japanese Patent Application No. 2014-230517.
Aug. 13, 2018 Office Action issued in Chinese Patent Application No. 201580061522.5.
Sep. 18, 2018 Office Action issued in Japanese Patent Application No. 2014-230517.
Mar. 11, 2019 Office Action issued in Taiwanese Patent Application No. 104137159.
May 17, 2019 Office Action issued in Chinese Patent Application No. 201580061522.5.
Cui, Jihai et al., "Professional Series 'Twelve-Five' Planning Textbook for National Preschool Education, Mathematics", Nankai University Publishing House, vol. 1, (2013), pp. 48-49.
Peng, Qi et al., "Series Textbooks for Vocational Education Basic Course: Mathematics", Zhengzhou University Publishing House, vol. 1, (2013), pp. 81.
Zhang, Ge et al., "General Course in Mathematics", Tongji University Publishing House, (2013), pp. 14-17.
Dec. 20, 2019 Office Action issued in Chinese Patent Application No. 201580061522.5.
Wang, W., "Silicon Crystal Solar Cell Manufacturing Technology", Machinery Industry Publishing House, (May 2014), p. 176.
Jul. 30, 2020 Office Action Issued in U.S. Appl. No. 16/273,497.
Apr. 10, 2020 Office Action issued in U.S. Appl. No. 16/273,497.
Jul. 3, 2020 Chinese Decision of Refusal issued in Chinese Application No. 201580061522.5.
Jan. 28, 2021 Office Action issued in U.S. Appl. No. 16/273,497.
May 7, 2021 Office Action Issued in U.S. Appl. No. 16/273,497.
Jan. 19, 2021 Office Action issued in Chinese Office Action No. 201580061522.5.
Shen, Wun-Jhong; "Solar Photovoltaic Technologies and Applications"; Energy and Environment Publishing Project; Shanghai Jiao Tong University Press; Oct. 2013; pp. 160, 163, 164.
Wang, Wun-Jing; "Crystalline Silicon Solar Cell Manufacturing Technology"; New Energy Application Technology Series; China Machine Press; May 2014; p. 323.
Mar. 2, 2021 Office Action issued in European Patent Application No. 15 858 822.8.
Sep. 13, 2021 Office Action issued in U.S. Appl. No. 16/273,497.
Mar. 22, 2022 Office Action Issued in U.S. Appl. No. 16/273,497.
Apr. 18, 2023 Notice of Allowance Issued In U.S. Appl. No. 16/273,497.
Oct. 8, 2022 Office Action issued in Chinese Patent Application No. 201911390646.4.
Oct. 20, 2022 Office Action issued in U.S. Appl. No. 16/273,497.
May 24, 2023 Office Action issued in Chinese Patent Application No. 201911390646.4.
Aug. 28, 2023 Decision of Refusal issued in Chinese Patent Application No. 201911390646.4.
Nov. 2, 2023 Office Action issued in Chinese Patent Application No. 202110702706.2.
Aug. 29, 2024 Office Action issued in Chinese Patent Application No. 201911390646.4.
May 16, 2024 Office Action issued in Chinese Patent Application No. 202110702706.2.
Jun. 19, 2024 Office Action issued in Chinese Patent Application No. 201911390646.4.
"Solar Cells and Their Applications" Lewis Fraas, 5.5.3, John Wiley & Sons, Inc., 2010.
Shen, Wun-Jhong, "Solar Photovoltaic Technologies and Applications," Energy and Environment Publishing Project, pp. 159, 161 and 162, Shanghai Jiao Tong University Press, Oct. 2013.
Oct. 30, 2024 Decision of Refusal issued in Chinese Patent Application No. 202110702706.2.

(56) References Cited

OTHER PUBLICATIONS

Jun. 4, 2025 Office Action issued in European Patent Application No. 15 858 822.8.

* cited by examiner

FIG. 4

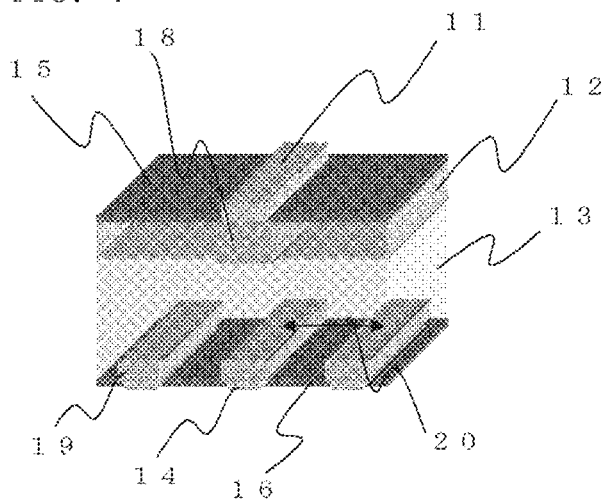

FIG. 5

(a) Preparing gallium-doped substrate
(b) Damage etching
(c) Texture etching
(d) Cleaning
(e) Forming N-type layer
(f) PN isolation
(g) Glass etching
(h) Forming passivation film on light-receiving surface
(i) Forming passivation film on backside
(j) Contact-opening on backside
(k) Printing and drying paste for back surface electrode
(l) Printing and drying paste for light-receiving surface electrode
(m) Firing

SOLAR CELL AND SOLAR CELL MODULE

This is a Continuation of application Ser. No. 16/731,132 filed Dec. 31, 2019, which in turn is a Continuation of application Ser. No. 16/273,497 filed Feb. 12, 2019, which in turn is a Continuation of application Ser. No. 15/523,923 filed May 2, 2017, which in turn is a national stage of PCT/JP2015/005190 filed Oct. 14, 2015, which claims priority to JP 2014-230517 filed Nov. 13, 2014. The disclosure of the prior applications is hereby incorporated by reference herein in its entirety.

TECHNICAL FIELD

The present invention relates to a solar cell and a solar cell module.

BACKGROUND ART

Semiconductor substrates for solar cells are usually manufactured by a Czochralski method (CZ method), which can produce a single crystal with a large-diameter at relatively low cost. For example, P-type semiconductor substrates can be obtained by drawing a silicon single crystal doped with boron by a CZ method, and slicing this single crystal.

Single crystal silicon solar cells (solar cells made of single crystal silicon substrates) have been configured to have a structure in which the whole surface of the backside (the surface opposite to the light-receiving surface) is in contact with the electrode via a Back Surface Field (BSF) structure.

The BSF structure can be easily introduced by a screen printing method, and is widely spread to be the mainstream of structures of present silicon single crystal solar cells.

To the BSF structure, a Passivated Emitter and Rear Contact Solar Cell (PERC) structure and a Passivated Emitter and Rear Locally Diffused Solar Cell (PERL) structure come to be introduced in order to further improve the efficiency.

The PERC structure and the PERL structure are methods to aggressively reduce the recombination rate of minority carriers on the back surface, that is, methods to reduce an effective surface recombination velocity on the back surface.

The cross section of a previous solar cell having a PERC structure is schematically shown in FIG. 9. As shown in FIG. 9, the solar cell 110 is provided with the N-type layer 112 on the side of the light-receiving surface of the silicon substrate 113 doped with boron (hereinafter, also described as a boron-doped substrate), and the finger electrodes 111 on this N-type layer 112. In many cases, the solar cells have the passivation layer 115 on the light-receiving surface. The solar cell is also provided with the passivation layer 116 on the back surface, the electrodes 114 on the back surface, and the contact areas 117 where the boron-doped substrate 113 is locally in contact with the back surface electrodes 114.

The cross section of a previous solar cell having a PERL structure is schematically shown in FIG. 10. As shown in FIG. 10, the solar cell 110' is the solar cell 110 that is provided with the P$^+$ layer (i.e., the layer which is doped with P-type dopant in higher concentration than the surrounding area (P-type silicon substrate)) 119 immediately under the back surface electrodes 114. This may be provided with N$^+$ layer (i.e., the layer which is doped with N-type dopant in higher concentration than the surrounding N-type layer 112) 118 under the light-receiving surface electrode 111. Other structures are similar to the solar cell having a PERC structure in FIG. 9, and the explanation is omitted.

CITATION LIST

Patent Literature

Patent Literature 1: pamphlet of International Patent Laid-Open Publication No. WO 2000/073542

SUMMARY OF INVENTION

Technical Problem

Even though a solar cell has the PERC structure or the PERL structure to reduce the recombination rate of minority carriers on the back surface, when the substrate is a boron-doped substrate, the interstitial boron atom combines with interstitial oxygen atoms by irradiated light to form a recombination site in the substrate bulk, which reduces the lifetime of the minority carriers to degrade the characteristics of the solar cell. This phenomenon is also referred to as light-induced degradation of a solar cell using a boron-doped substrate.

In solar cells having the PERC structure and the PERL structure, the electrode on the back surface is localized. This generates current crowding in the vicinity of the contact (i.e., the contact area where the substrate is in contact with the back surface electrode), and tends to cause resistance loss. Accordingly, a substrate with low resistance is preferable in the solar cell having the PERC structure or the PERL structure. However, when using a substrate with low resistance, that is, in a situation in which more boron atoms are contained, the combination of a boron atom and oxygen atoms increases to make the degradation (light-induced degradation) noticeable thereby.

On the other hand, using a substrate with higher resistance reduces the degradation. In a solar cell having the PERC structure or the PERL structure, however, current crowding significantly generates in the vicinity of the contact on the back surface to cause resistance loss as described above. As a result, the characteristics degrade also in this case.

To eliminate the light-induced degradation, Patent Literature 1 suggests the use of gallium as P-type dopant instead of boron. It has been impossible to sufficiently prevent the resistance loss, however, only by using a silicon substrate doped with gallium (hereinafter, also referred to as a gallium-doped substrate) as the substrate of the solar cell having the PERC structure or the PERL structure.

The present invention was accomplished in view of the above-described problems. It is an object of the present invention to provide a solar cell and a solar cell module having excellent conversion efficiency with the resistance loss being prevented, with the solar cell using a substrate the light-induced degradation of which is eliminated.

Solution to Problem

To achieve the above-described object, the present invention provides a solar cell comprising a P-type silicon substrate in which one main surface is a light-receiving surface and another main surface is a backside, a plurality of back surface electrodes formed on a part of the backside, an N-type layer in at least a part of the light-receiving surface of the P-type silicon substrate, and contact areas in which the P-type silicon substrate is in contact with the back surface electrodes;

wherein the P-type silicon substrate is a silicon substrate doped with gallium;

the P-type silicon substrate has a resistivity of 2.5 Ω·cm or less; and a back surface electrode pitch $P_{rm}$ [mm] of the plurality of back surface electrodes and the resistivity $R_{sub}$ [Ω·cm] of the P-type silicon substrate satisfy the relation represented by the following formula (1)

$$\log(R_{sub}) \leq -\log(P_{rm}) + 1.0 \quad (1).$$

In such a solar cell, since the substrate is a gallium-doped substrate, the light-induced degradation is eliminated. The substrate is also a substrate with lower resistance, which hardly generates current crowding in the contact area to scarcely cause resistance loss. The solar cell has the PERC structure with a lower resistance substrate, and can sufficiently reduce the recombination rate of the minority carriers on the back surface side. In addition to these structures, the pitch of the electrodes on the back surface (hereinafter, also referred to as a back surface electrode pitch) and the resistivity of the substrate satisfy the relation represented by the foregoing formula (1), which makes it possible to minimize the resistance loss due to the current crowding and to further increase the output power.

It is preferable that the resistivity of the P-type silicon substrate be 0.2 Ω·cm or more.

Such solar cells can generate excess current in virtually the same level even when the solar cell module is composed of solar cells with different resistivity. Accordingly, excess loss can be reduced when the solar cell module is fabricated using such solar cells.

It is also preferable that the pitch of back surface electrodes be 10 mm or less.

Such a solar cell can be definitely a solar cell with excellent conversion efficiency.

It is also preferable that each of the contact areas have a higher P-type dopant concentration than other area.

Such a solar cell with a PERL structure having a so-called $P^+$ layer is excellent in conversion efficiency.

It is also preferable that the total area of the contact areas be 20% or less of the total backside area.

Such a solar cell makes it possible to further reduce the carrier recombination on the contact between the substrate and the electrode while making the contact resistance lower between the substrate and the electrode.

The present invention also provides a solar cell module comprising the inventive solar cell.

In the inventive solar cell, the light-induced degradation and the resistance loss are eliminated, while the conversion efficiency is excellent. Accordingly, in the solar cell module provided with the inventive solar cell, the light-induced degradation and the resistance loss are eliminated, while the conversion efficiency is excellent.

Advantageous Effects of Invention

In the inventive solar cell, since the substrate is a gallium-doped substrate, the light-induced degradation is eliminated. The substrate is also a substrate with lower resistance, which hardly generates current crowding near the contact area to scarcely cause resistance loss. The solar cell has the PERC structure or the PERL structure with a lower resistance substrate, and can sufficiently reduce the recombination rate of the minority carriers on the back surface side. In addition to these structures, the electrode pitch on the back surface and the resistivity of the substrate satisfy the relation represented by the foregoing formula (1), which makes it possible to minimize the resistance loss due to the current crowding and to further increase the output power.

BRIEF DESCRIPTION OF DRAWINGS

FIG. 4 is a schematic drawing of the solar cell shown in FIG. 3 on a perspective projection of the P-type silicon substrate;

FIG. 5 is a flow diagram of an example of a method for manufacturing the inventive solar cell;

DESCRIPTION OF EMBODIMENTS

Hereinafter, the present invention will be more specifically described.

As described above, an excellent conversion efficiency solar cell with eliminating the resistance loss has been demanded for solar cells using a substrate which eliminates the light-induced degradation. As a structure that can enhance the conversion efficiency, the PERC structure and the PERL structure have been proposed. However, only by using a gallium-doped substrate which can eliminate light-induced degradation for a solar cell having the PERC structure or the PERL structure, it has been impossible to sufficiently prevent resistance loss to provide the solar cell with excellent conversion efficiency.

The inventor has diligently investigated to solve the problems. As a result, the inventor has found that the foregoing problem can be solved with the solar cell having a PERC structure or a PERL structure provided with a gallium-doped substrate having a lower resistance, with the back surface electrode pitch and the resistivity substrate satisfying a specific relation; thereby brought the inventive solar cell and the solar cell module to completion.

Hereinafter, an embodiment of the present invention will be specifically described with reference to FIGS, but the present invention is not limited thereto.

[Solar Cell]

Figure 1:
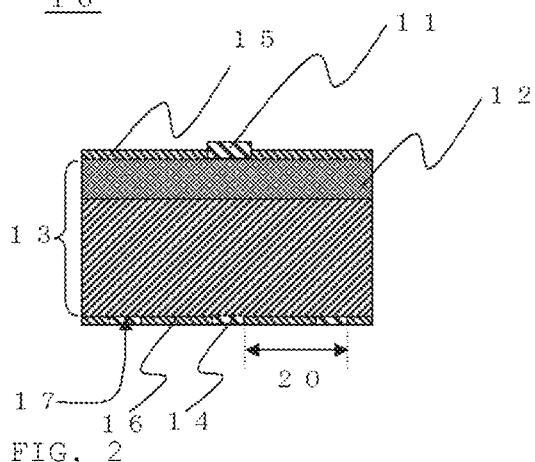
FIG. 1 is a sectional view showing an example of the inventive solar cell.
Figure 2:
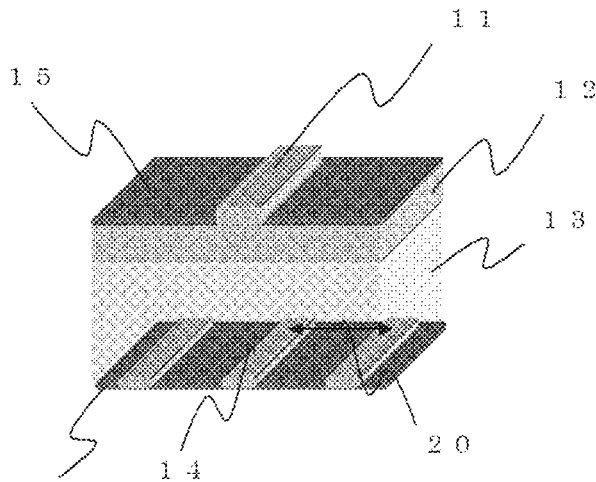
FIG. 2 is a schematic drawing of the solar cell shown in FIG. 1 on a perspective projection of the P-type silicon substrate.

FIG. 1 is a sectional view showing an example of the inventive solar cell. FIG. 2 is a schematic drawing of the solar cell shown in FIG. 1 on a perspective projection of the P-type silicon substrate 13. As shown in FIG. 1 and FIG. 2, the inventive solar cell 10 is provided with the P-type silicon substrate (gallium-doped substrate) 13 in which one of the main surface is a light-receiving surface and another main surface is a backside. This also has a plurality of back surface electrodes 14 formed on a part of the backside of the P-type silicon substrate 13. The P-type silicon substrate 13 has an N-type layer 12 in at least a part of the light-receiving surface, and also has the contact areas 17 where the P-type silicon substrate 13 is in contact with the back surface electrodes 14. The N-type layer 12 is generally provided with the light-receiving surface electrode 11 thereon.

In the present invention, the P-type silicon substrate 13 is a gallium-doped substrate. By changing the P-type dopant from boron to gallium like this, the light-induced degradation can be eliminated. The P-type silicon substrate 13 has a resistivity (specific resistance) of 2.5 Ω·cm or less. The resistivity more than 2.5 Ω·cm can cause current crowding in the vicinity of portions on the back surface side where the P-type silicon substrate 13 is in contact with the back surface electrodes 14, which can cause resistance loss.

As described above, the inventive solar cell is provided with a gallium-doped substrate having lower resistance (i.e., a substrate with high gallium concentration). The solar cell having a PERC structure or a PERL structure is particularly excellent in conversion efficiency when having a substrate with lower resistance. Accordingly, the inventive solar cell is particularly excellent in conversion efficiency. The inventive solar cell, having a gallium-doped substrate with lower resistance, hardly yield light-induced degradation, which occurs in a boron-doped substrate with lower resistance (i.e., a substrate with high boron concentration), and can keep the high efficiency.

In the inventive solar cell 10, the back surface electrode pitch $P_{rm}$ [mm] of the plurality of back surface electrodes 14 and the resistivity $R_{sub}$ [Ω·cm] of the P-type silicon substrate 13 satisfy the relation represented by the following formula (1)

$$\log(R_{sub}) \leq -\log(P_{rm}) + 1.0 \qquad (1).$$

The back surface electrode pitch 20 is shown in FIG. 1. When the back surface electrode pitch 20 and the resistivity of the gallium-doped substrate 13 do not satisfy the relation represented by the formula (1), it is not possible to sufficiently prevent resistance loss due to current crowding, causing the decrease in the output power. The relation of the formula (1) was obtained by the following computer simulation.

In the solar cell shown in FIG. 1, the conversion efficiency of the solar cell was simulated by using a computer, as a function of the electrode pitch on the back surface and the resistivity of the gallium-doped substrate. The results are shown in FIG. 6.

Figure 9:
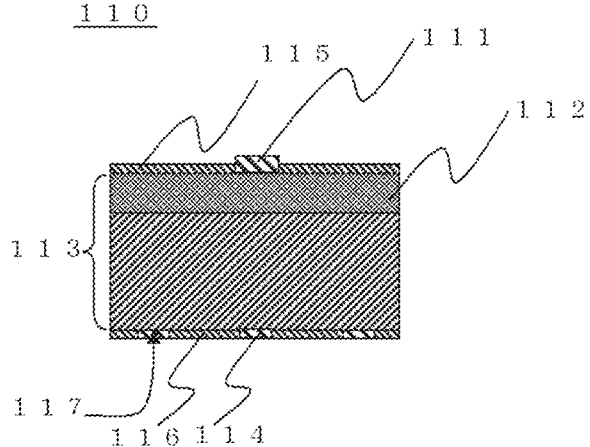
FIG. 9 is a sectional view schematically showing a previous solar cell having a PERC structure.
Figure 10:
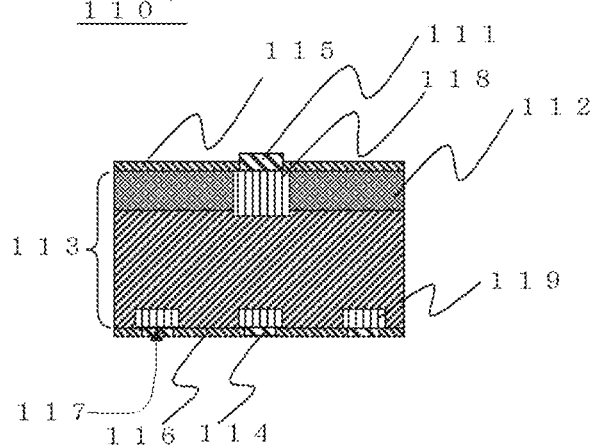
FIG. 10 is a sectional view schematically showing a previous solar cell having a PERL structure.

In the solar cell shown in FIG. 9, the conversion efficiency of the solar cell was also simulated by using a computer, as a function of the electrode pitch on the back surface and the resistivity of the boron-doped substrate. The results are shown in FIG. 7. In FIG. 6 and FIG. 7, the conversion efficiency is shown by the light and shade. It is also shown by contour lines of conversion efficiency, each of which links each point of combination of the resistivity of the substrate and the back surface electrode pitch.

Figure 6:
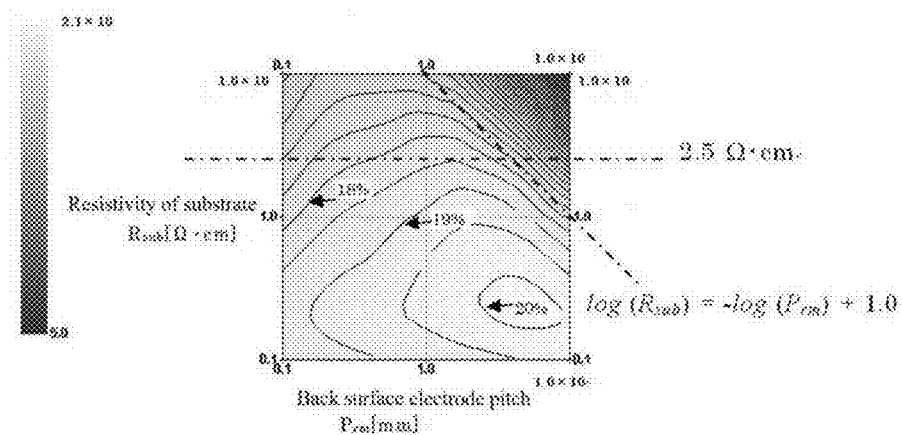
FIG. 6 is a diagram of the average conversion efficiency of the solar cell as a function of the electrode pitch on the back surface and the substrate resistivity of the gallium-doped substrate after sufficient irradiation of the sunlight.
Figure 7:
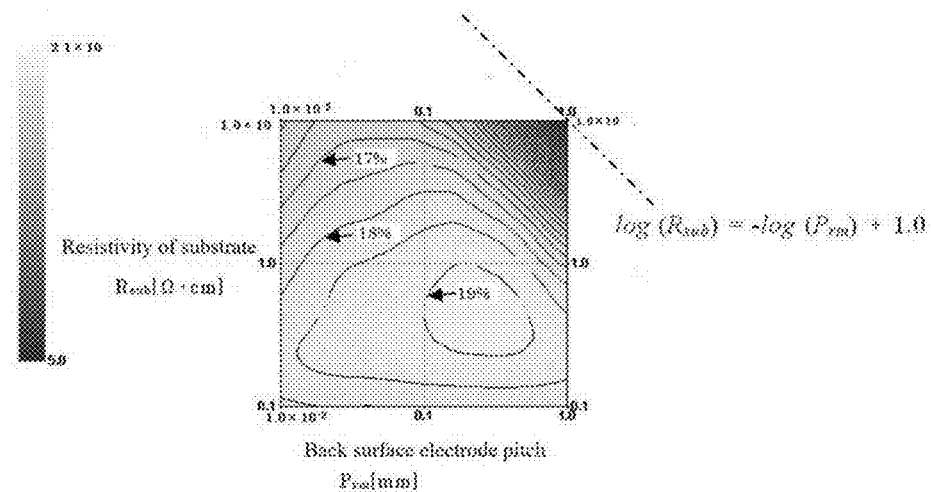
FIG. 7 is a diagram of the average conversion efficiency of the solar cell as a function of the electrode pitch on the back surface and the substrate resistivity of the boron-doped substrate after sufficient irradiation of the sunlight.

FIG. 6 is a diagram showing the average conversion efficiency of the solar cell as a function of the electrode pitch on the back surface and the substrate resistivity of the gallium-doped substrate after sufficient irradiation of the sunlight. As shown in FIG. 6, when the resistivity of the gallium-doped substrate was 2.5 Ω·cm or less, and the back surface electrode pitch and the substrate resistivity of a gallium-doped substrate satisfied the relation represented by the foregoing formula (1), the results of conversion efficiency were excellent. On the other hand, as shown in FIG. 6, the conversion efficiency suddenly dropped when the resistivity was more than 2.5 Ω·cm or when the formula (1) was not satisfied.

FIG. 7 is a diagram of the average conversion efficiency of the solar cell as a function of the electrode pitch on the back surface and the substrate resistivity of the boron-doped substrate after sufficient irradiation of the sunlight. As shown in FIG. 7, when a boron-doped substrate was used, the conversion efficiency was inferior to the case of using a gallium-doped substrate. This shows an influence of light-induced degradation. In this instance, the conversion efficiency suddenly dropped in some cases even when the back surface electrode pitch and the substrate resistivity of a boron-doped substrate satisfied the relation represented by the formula (1).

Figure 8:
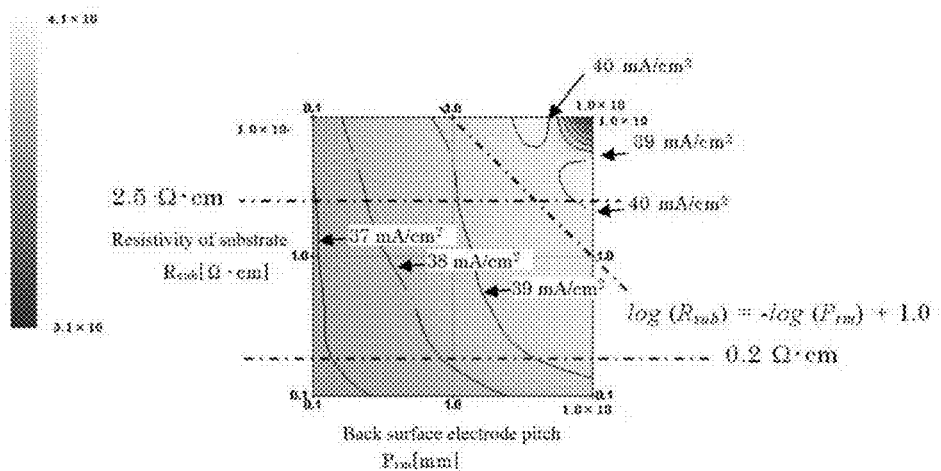
FIG. 8 is a diagram of the average short-circuit current density of the solar cell as a function of the electrode pitch on the back surface and the substrate resistivity of the gallium-doped substrate.

In the solar cell shown in FIG. 1, the short-circuit current density of the solar cell was simulated, as a function of the electrode pitch on the back surface and the resistivity of the gallium-doped substrate. The results are shown in FIG. 8. FIG. 8 is a diagram showing the average short-circuit current density of the solar cell as a function of the electrode pitch on the back surface and the substrate resistivity of the gallium-doped substrate. In FIG. 8, the short-circuit current density are shown by the light and shade. They are also shown as contour lines of the short-circuit current density, each of which links each point of combination of the resistivity of the substrate and the back surface electrode pitch. As shown in FIG. 8, when the resistivity of a gallium-doped substrate was 2.5 Ω·cm or less, and the back surface electrode pitch and the resistivity of the gallium-doped substrate satisfied the relation represented by the formula (1), the short-circuit current density showed smaller variation than the substrate resistivity.

When the resistivity of a gallium-doped substrate was 0.2 Ω·cm or more, the short-circuit current density showed much smaller variation than the substrate resistivity. These results reveal that the solar cell which has a resistivity of 0.2 Ω·cm or more and 2.5 Ω·cm or less and satisfies the relation represented by the formula (1) shows similar current even when the solar cells have resistivity variation. Accordingly, it turned out that these solar cells can reduce excess loss when they are modularized. As described above, it is preferable that the resistivity of the P-type silicon substrate (gallium-doped substrate) 13 be 0.2 Ω·cm or more.

The thickness of the P-type silicon substrate 13 is not particularly limited, and can be a thickness of 100 to 200 μm, for example. The shape and area of the main surface of the P-type silicon substrate 13 is not particularly limited.

It is also preferable that the back surface electrode pitch 20 of the plurality of back surface electrodes be 10 mm or less. Such a solar cell is excellent in conversion efficiency as shown in FIG. 6. The lower limit of the back surface electrode pitch 20 is not particularly limited, and can be 1 mm, for example.

Figure 3:
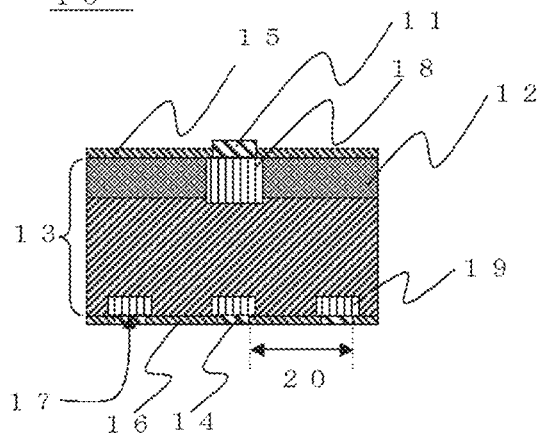
FIG. 3 is a sectional view showing an example of the inventive solar cell.

It is also preferable that each P-type dopant concentration in the contact areas 17 be higher than the P-type dopant concentration in an area other than the contact areas 17. As an example of such a solar cell having a PERL structure, the solar cell shown in FIG. 3 and FIG. 4 can be enumerated. FIG. 3 is a sectional view showing an example of the inventive solar cell. FIG. 4 is a schematic drawing of the solar cell shown in FIG. 3 on a perspective projection of the P-type silicon substrate 13. In the solar cell shown in FIG. 3 and FIG. 4, the same reference number is given to each of the same components as those in the solar cell shown in FIG. 1, and the explanation is omitted. As shown in FIG. 3 and FIG. 4, the solar cell 10' is the one in which the foregoing solar cell 10 is provided with N+ layer 18 immediately under the light-receiving surface electrode 11, and the P+ layer 19 immediately under the back surface electrodes 14 (in the vicinity of the contact areas 17). Such a solar cell having a PERL structure can be a solar cell that is excellent in conversion efficiency.

It is also preferable that the total area of the contact areas 17 be 20% or less on the basis of the whole of the backside. In such a solar cell, it is possible to further reduce the recombination of carriers due to the contact between the substrate and the electrode while making the contact resistance much lower between the substrate and the electrode. The lower limit of the total area of the contact areas 17 is not particularly limited, and can be 5%, for example. The electrode widths of the light-receiving surface electrode 11 and the back surface electrodes 14 are not particularly limited, and can be 15 to 100 μm, for example.

As shown in FIG. 1, the inventive solar cell 10 is generally provided with the surface passivation layer 16 on the back surface. It is also possible to have the surface passivation layer 15 on the light-receiving surface. The passivation layer 15 on the light-receiving surface can also act as an anti-reflection film, etc. As these passivation layers, it is possible to use a silicon nitride layer (SiNx layer) and $SiO_2$ layer, which can be fabricated by using a plasma CVD, and to use a thermal oxide layer too. The effect on anti-reflection shows maximum value when the layer thickness of the anti-reflection film is 85 to 105 nm, which is favorable.

It is also possible to have metal such as aluminum on the whole surface of the back surface passivation layer 16 to form a structure in which the plurality of back surface electrodes 14 are connected with each other (i.e., a structure in which the back surface electrodes 14 are integrated).

Illustrative examples of the N-type dopant contained in the N-type layer 12 and the N+ layer 18 include P (phosphorus), Sb (antimony), As (arsenic), and Bi (bismuth). Illustrative examples of the P-type dopant contained in the P+ layer 19 include B (boron), Ga (gallium), Al (aluminum), and In (indium).

[Solar Cell Module]

Subsequently, the inventive solar cell module will be described. The inventive solar cell module is provided with the foregoing inventive solar cell. Specifically, it can be formed by connecting a plurality of the arranged inventive solar cells in series by using an inter connector, for example. Various module structures can be applied without limiting thereto. In such a solar cell module, the light-induced degradation and resistance loss are eliminated, and the conversion efficiency is excellent.

[Method for Manufacturing Solar Cell]

Then, the method for manufacturing the inventive solar cell will be described with reference to FIG. 5. FIG. 5 is a process flow diagram showing an example of a method for manufacturing the inventive solar cell. The method described below is a typical example, and the method for manufacturing the inventive solar cell is not limited thereto. First, as shown in FIG. 5 (a), a gallium-dopes substrate with a resistivity of 2.5 Ω·cm or less is prepared for the P-type silicon substrate in which one main surface is a light-receiving surface and another main surface is a backside.

It is preferable that the resistivity of the gallium-doped substrate prepared in the step (a) be 0.2 Ω·cm or more. When using a gallium-doped substrate, since the segregation coefficient of gallium is relatively high, the resistivity of an ingot grown by a CZ method differs by about six times at the top and at the tail. In order to manufacture a solar cell at low cost, it is desirable to use each of these ingots entirely one piece, and it is preferable that the difference of the resistivity of a substrate be considered in the design stage. By preparing a gallium-doped substrate with a resistivity of 0.2 Ω·cm or more in the step (a), it is possible to manufacture plural solar cells having a PERC structure or a PERL structure which can show similar current even when these solar cells differ the resistivity by about six times, and to reduce excess loss when these solar cells are modularized. This makes it possible to manufacture a solar cell module at lower cost. The method for measuring the resistivity of a gallium-doped substrate is not particularly limited, and includes a four-point prove method, for example.

The silicon single crystal from which the gallium-doped substrate is sliced can be produced by a CZ method, for example, as described above. In this case, gallium and a polycrystalline material may be introduced into a crucible in a lump to form a raw material melt. It is desirable to produce dopant by producing and pulverizing a silicon single crystal doped with higher concentration of gallium, and to adjust the concentration by introducing the dopant into melted polycrystalline silicon for CZ material so as to have a desired concentration, since it is necessary to precisely adjust the concentration, particularly in mass production. The gallium-doped substrate can be obtained by slicing thus obtained gallium-doped silicon single crystal.

Subsequently, slice damages on the surface of the substrate can be removed by etching with a high-concentration alkaline solution such as sodium hydroxide and potassium hydroxide in a concentration of 5 to 60%, or mixed acid of hydrofluoric acid and nitric acid, etc. as shown in FIG. 5 (b).

Then, the substrate surface can be processed to form micro-roughness called texture as shown in FIG. 5 (c). The texture is an effective method to reduce the reflectance of a solar cell. The texture can be produced by immersing the substrate in heated alkaline solution (concentration: 1 to 10%, temperature: 60 to 100° C.) such as sodium hydroxide, potassium hydroxide, potassium carbonate, sodium carbonate, and sodium hydrogencarbonate for about 10 minutes to 30 minutes. In many cases, a certain amount of 2-propanol (IPA: isopropyl alcohol) is added to the foregoing solution to promote the reaction.

After the damage-etching and texture formation, it is preferable to clean the substrate as shown in FIG. 5 (d). The cleaning can be performed by using an aqueous acid solution of hydrochloric acid, sulfuric acid, nitric acid, hydrofluoric acid, or mixed solvent thereof; or pure water, for example.

Subsequently, as shown in FIG. 5 (e), N-type layer is formed on the light-receiving surface of the gallium-doped substrate.

The method for forming an N-type layer in the step (e) is not particularly restricted. For example, it is possible to enumerate a method to thermally diffuse the dopant. This includes a vapor phase diffusion method in which $POCl_3$ (phosphoryl chloride) and the like introduced into a quartz tube furnace with carrier gas are diffused or a coating diffusion method in which a phosphorus-containing material and the like applied onto a substrate is diffused by thermal treatment. The coating method in the coating diffusion method includes spin-coating method, spray-coating method, ink-jet method, and screen printing method.

In the coating diffusion method, the N-type layer can be formed by coating the light-receiving surface with a material which contains N-type dopant followed by thermal treatment. For the material which contains N-type dopant, it is possible to use a phosphorus diffusion source, which turns to glass by thermal treatment. This phosphorus diffusion source includes any known ones, and can be obtained by mixing $P_2O_5$, pure water, polyvinyl alcohol (PVA), and tetraethyl orthosilicate (TEOS), for example.

For a method for manufacturing a solar cell having a PERL structure provided with an $N^+$ layer on the light-receiving surface side and a P layer on the back surface side, it is possible to enumerate a method in which the light-receiving surface is locally coated with the N-type dopant-containing material, and the back surface is locally coated with P-type dopant-containing material, and then the substrate is subjected to a thermal treatment. In this case, it is possible to form diffusion masks on the light-receiving surface and/or the back surface in order to prevent auto-doping and then to perform the thermal treatment in plural times.

For the P-type dopant-containing material, it is possible to use a boron diffusion source, which turns to glass by thermal treatment. This boron diffusion source includes any known ones, and can be obtained by mixing $B_2O_3$, pure water, and PVA, for example.

Then, as shown in FIG. 5 (f), the PN junction is isolated by using a plasma etcher. In this process, samples are stacked so as to prevent plasma and radical from getting into the light-receiving surface or the backside, and the side faces of the substrate are dry-etched by several microns under this stacked condition. This PN isolation by plasma etching may be performed before removing the boron glass and phosphorus glass or may be performed after the removal. It is also possible to form a trench with laser as an alternative method to the PN isolation.

After the step (e), not a little quantity of glass layer is formed on the surface of the substrate. The glass on the surface is removed by hydrofluoric acid, etc., as shown in FIG. 5 (g).

Subsequently, as shown in FIG. 5 (h), a surface passivation layer can be formed on the light-receiving surface of the gallium-doped substrate. For the light-receiving surface passivation layer, it is possible to use the same ones described in the item of the solar cell.

Then, as shown in FIG. 5 (i), a surface passivation layer can be deposited on the back surface of the gallium-doped substrate. For the back surface passivation layer, it is possible to use the same ones described in the item of the solar cell.

Subsequently, as shown in FIG. 5 (j), the back surface passivation layer can be removed just on the contact area for a back surface electrode. The removal of the back surface passivation layer can be performed by using a photolithography method or an etching paste, for example. This etching paste contains at least one selected from the group consisting of phosphoric acid, hydrofluoric acid, ammonium fluoride, and ammonium hydrogen fluoride as an etching component together with water, organic solvent, and a viscosity agent, for example.

At this stage, it is possible to determine a pitch to remove the back surface passivation layer in the step (j) (which corresponds to an pitch of the contact areas) on the basis of the relation represented by the formula (1) for the resistivity of the gallium-doped substrate prepared in the step (a). This makes it possible to certainly manufacture a solar cell that is excellent in conversion efficiency. It is also possible to precisely determine the upper and the lower limits of the back surface electrode pitch $P_{rm}$ [mm] and the resistivity $R_{sub}$ [Ω·cm] to fabricate the solar cell.

Then, as shown in FIG. 5 (k), a paste for a back surface electrode is printed onto the backside of the gallium-doped substrate, followed by drying. For example, a paste in which Al powders are mixed with an organic binder is applied onto the backside of the substrate by screen printing. For a material of the back surface electrode, Ag and so on also can be used. The back surface electrode needs to be formed on the contact area at least. Alternatively, the back surface electrode may be formed and integrated to the whole back surface. In this case, the back surface electrode actually contacts the substrate locally.

Subsequently, as shown in FIG. 5 (l), a paste for a light-receiving surface electrode is printed onto the light-receiving surface of the gallium-doped substrate, followed by drying. For example, an Ag paste in which Ag powders and glass frit are mixed with an organic binder is applied onto the light-receiving surface of the substrate by screen printing. The step (k) and the step (l) may be performed in the opposite order.

After the foregoing printing of the electrodes, for the paste on a light-receiving surface electrode and the paste on a back surface electrode, firing is done as shown in FIG. 5 (m). In this way, the light-receiving surface electrode and the back surface electrode are formed by printing the pastes followed by firing. The firing is generally performed by thermal treatment at a temperature of 700 to 800° C. for 5 to 30 minutes. This thermal treatment makes the Ag powders penetrate to the passivation layer (fire through) on the light-receiving surface side to electrically conduct the light-receiving surface electrode and the gallium-doped substrate. It is also possible to bake back surface electrode and the light-receiving surface electrode separately.

In such a process, the solar cell shown in FIG. 1 and FIG. 3 can be manufactured. The inventive solar cell module can be obtained by modularizing the solar cells thus obtained.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A solar cell comprising:
a P-type silicon substrate in which one main surface is a light-receiving surface and the other main surface is a backside;
a back surface passivation layer provided on a whole of the backside of the P-type silicon substrate;
a backside electrode comprising a plurality of back surface electrodes provided in the back surface passivation layer so as to be in contact with the P-type silicon substrate in a plurality of contact areas;
an N-type layer formed on at least a part of the light-receiving surface of the P-type silicon substrate;
a light-receiving surface passivation layer; and
a light-receiving surface electrode that is in electrical contact with the N-type layer,
wherein:
the P-type silicon substrate is a silicon single crystal substrate doped with gallium and is produced from an ingot grown by a Czochralski method,
the P-type silicon substrate has a resistivity of 0.2 to 2.5 Ω·cm,
a total area of the plurality of contact areas is in a range of from about 5 to 20% on the basis of the whole area of the backside,
the plurality of contact areas has a pitch $P_{rm}$ [mm] of 0.1 to 10 mm, the pitch $P_{rm}$ [mm] of the plurality of contact areas and the resistivity $R_{sub}$ [Ω·cm] of the P-type silicon substrate satisfy the relation represented by the following formula (1)

$$\log(R_{sub}) \leq -\log(P_{rm}) + 1.0 \tag{1},$$

a value of the pitch $P_{rm}$ [mm] further is such that, with the proviso that the pitch $P_{rm}$ [mm] is in the horizontal axis and the resistivity $R_{sub}$ [Ω·cm] is in the vertical axis, a short-circuit current density is more than −37 38 mA/cm² and less than about 40 mA/cm², and shows a smaller variation than the resistivity of the P-type silicon, substrate and the solar cell shows a similar current throughout the range of 0.2 to 2.5 Ω·cm of the resistivity of the P-type silicon substrate, and a conversion efficiency of the solar cell is about 20%.

2. A solar cell comprising:
a P-type silicon substrate in which one main surface is a light-receiving surface and the other main surface is a backside;
a back surface passivation layer provided on a whole of the backside of the P-type silicon substrate;
a backside electrode comprising a plurality of back surface electrodes provided in the back surface passivation layer so as to be in contact with the P-type silicon substrate in a plurality of contact areas, the plurality of back surface electrodes being connected with each other in such a manner that the plurality of back surface electrodes are integrated and formed over a whole surface of the back surface passivation layer;
an N-type layer formed on at least a part of the light-receiving surface of the P-type silicon substrate;
a light-receiving surface passivation layer; and
a light-receiving surface electrode that is in electrical contact with the N-type layer,
wherein:
the P-type silicon substrate is a silicon single crystal substrate doped with gallium and is produced from an ingot grown by a Czochralski method;
the P-type silicon substrate has a resistivity of 0.2 to 2.5 Ω·cm;
a total area of the plurality of contact areas is in a range of from about 5 to 20% on the basis of the whole area of the backside;
the plurality of contact areas has a pitch $P_{rm}$ [mm] of 0.1 to 10 mm;
the pitch $P_{rm}$ [mm] of the plurality of contact areas and the resistivity $R_{sub}$ [Ω·cm] of the P-type silicon substrate satisfy the relation represented by the following formula (1)

$$\log(R_{sub}) \leq -\log(P_{rm}) + 1.0 \tag{1},$$

a value of the pitch $P_{rm}$ [mm] further has a value is such that, with the proviso that the pitch $P_{rm}$ [mm] is in the horizontal axis and the resistivity $R_{sub}$ [Ω·cm] is in the vertical axis, a short-circuit current density is more than 38 mA/cm² and less than about 40 mA/cm², and shows a smaller variation than the resistivity of the P-type silicon, substrate and the solar cell shows a similar current throughout the range of 0.2 to 2.5 Ω·cm of the resistivity of the P-type silicon substrate, and
a conversion efficiency of the solar cell is about 20%.

3. The solar cell according to claim 1, wherein the pitch of the plurality of contact areas is formed by removing the back surface passivation layer according to the relation represented by the formula (1).

4. The solar cell according to claim 2, wherein the pitch of the plurality of contact areas is formed by removing the back surface passivation layer in the relation represented by the formula (1).

5. The solar cell according to claim 1, wherein the light-receiving surface electrode and the contact areas have a width of 15 to 100 μm.

6. The solar cell according to claim 2, wherein the light-receiving surface electrode and the contact areas have a width of 15 to 100 μm.

7. The solar cell according to claim 3, wherein the light-receiving surface electrode and the contact areas have a width of 15 to 100 μm.

8. The solar cell according to claim 4, wherein the light-receiving surface electrode and the contact areas have a width of 15 to 100 μm.

9. The solar cell according to claim 1, wherein each of the contact areas has a higher P-type dopant concentration than other areas on the backside of the P-type silicon substrate.

10. The solar cell according to claim 2, wherein each of the contact areas has a higher P-type dopant concentration than other areas on the backside of the P-type silicon substrate.

11. A solar cell module comprising a plurality of the solar cells according to claim 1, which are connected in series.

12. A solar cell module comprising a plurality of the solar cells according to claim 2, which are connected in series.

13. The solar cell according to claim 1, further comprising
an $N^+$-type layer which is electrically connected to the electrode on the light-receiving surface, the $N^+$-type layer being in the N-type layer and
a plurality of $P^+$-type layers which are electrically connected to the back surface electrodes, the $P^+$-type layers being formed in the backside surface of the P-type silicon substrate.

14. The solar cell according to claim 2, further comprising
an $N^+$-type layer which is electrically connected to the electrode on the light-receiving surface, the $N^+$-type layer being in the N-type layer and
a plurality of $P^+$-type layers which are electrically connected to the back surface electrodes, the $P^+$-type layers being formed in the backside surface of the P-type silicon substrate.

15. The solar cell according to claim 2, wherein the P-type silicon substrate has a thickness in a range of from 100 to 200 μm.

16. A solar cell comprising:
a P-type silicon substrate in which one main surface is a light-receiving surface and the other main surface is a backside;
a back surface passivation layer provided on a whole of the backside of P-type silicon substrate;
a backside electrode comprising a plurality of back surface electrodes provided in the back surface passivation layer so as to be regularly provided in contact with the P-type silicon substrate in a plurality of contact areas;
an N-type layer formed on at least a part of the light-receiving surface of the P-type silicon substrate;
a light-receiving surface passivation layer; and
a light-receiving surface electrode that is in electrical contact with the N-type layer, wherein:
the P-type silicon substrate is a silicon single crystal substrate doped with gallium;
the P-type silicon substrate has a resistivity in a range of 0.2 to 2.5 Ω·cm;
the P-type silicon substrate is produced from an ingot grown by a Czochralski method;

the plurality of contact areas are provided in a plurality of regular patterns provided with a regular pitch;

a total area of the plurality of contact areas is in a range of from about 5 to 20% on the basis of the whole area of the backside;

a value of the regular pitch is such that, with the proviso that the pitch is in the horizontal axis and the resistivity is in the vertical axis, a short-circuit current density is more than 38 mA/cm$^2$ and less than about 40 mA/cm$^2$, shows smaller variations as compared to the resistivity of the P-type silicon; substrate, and the solar cell shows a similar current throughout the range of 0.2 to 2.5 Ω·cm of the resistivity of the P-type silicon substrate; and a conversion efficiency of the solar cell is about 20%.

17. A solar cell module comprising a plurality of the solar cells according to claim 16, wherein the plurality of solar cells vary in resistance and are connected in series.

18. A solar cell comprising:
- a P-type silicon single crystal substrate doped with gallium and having a resistivity of 0.2 to 2.5 Ω·cm in which one main surface is a light-receiving surface and the other main surface is a backside, the P-type silicon single crystal substrate being produced from an ingot grown by a Czochralski method;
- an N-type layer formed on at least a part of the light-receiving surface of the P-type silicon single crystal substrate; and
- a backside electrode comprising a plurality of back surface electrodes formed onto the backside of the P-type silicon single crystal substrate, wherein a back surface electrode pitch $P_{rm}$ [mm] of the plurality of the back surface electrodes and the resistivity $R_{sub}$ [Ω·cm] of the P-type silicon substrate satisfy the relation represented by the following formula (1)

$$\log(R_{sub}) \leq -\log(P_{rm}) + 1.0 \tag{1},$$

wherein:
the back surface electrode pitch $P_{rm}$ [mm] has a value such that, with the proviso that the pitch $P_{rm}$ [mm] is in the horizontal axis of a diagram shown by $R_{sub}$ versus $P_{rm}$ and the resistivity $R_{sub}$ [Ω·cm] of the P-type silicon single crystal substrate is in the vertical axis of the diagram, a variation in a short-circuit current density of the solar cell is smaller as compared to a variation in the resistivity of the P-type silicon single crystal substrate, the short-circuit current density is within a value defined by the lines of 0.2 Ω·cm and 2.5 Ω·cm of the resistivity of the substrate and the line of log $(R_{sub})=-$log $(P_{rm})+1.0$, and the solar cell has a similar current throughout the range of 0.2 to 2.5 Ω·cm of the resistivity of the P-type silicon single crystal substrate, the back surface electrode pitch is 0.1 mm or more and 10 mm or less, a total area of contact areas of the back surface electrodes is in a range of from about 5 to 20%, on the basis of the whole area of the backside, and a conversion efficiency of the solar cell is about 20%.

19. A solar cell comprising:
a P-type silicon single crystal substrate doped with gallium and having a resistivity of 0.2 to 2.5 Ω·cm in which one main surface of the substrate is a light-receiving surface and the other main surface is a backside, the P-type silicon single crystal substrate being produced from an ingot grown by a Czochralski method;

an N-type layer formed on at least a part of the light-receiving surface of the P-type silicon single crystal substrate; and a backside electrode comprising a plurality of back surface electrodes formed on the backside of the P-type silicon single crystal substrate with a back surface electrode pitch $P_{rm}$ [mm];

wherein the back surface electrode pitch and the resistivity $R_{sub}$ [Ω·cm] of the P-type silicon single crystal substrate satisfy the relation represented by the following formula (1)

$$\log(R_{sub}) \leq -\log(P_{rm}) + 1.0 \tag{1; and}$$

the back surface electrodes are in electrical contact with the backside of the substrate; and wherein:

the back surface electrode pitch $P_{rm}$ [mm] has a value such that, with the proviso that the pitch $P_{rm}$ [mm] is in the horizontal axis of a diagram shown by $R_{sub}$ versus $P_{rm}$ and the resistivity $R_{sub}$ [Ω·cm] of the P-type silicon single crystal substrate is in the vertical axis of the diagram, a variation in a short-circuit current density of the solar cell is smaller as compared to a variation in the resistivity of the P-type silicon single crystal substrate, the short-circuit current density is within a value defined by the lines of 0.2 Ω·cm and 2.5 Ω·cm of the resistivity of the substrate and the line of log $(R_{sub})=-$log $(P_{rm})+1.0$, and the solar cell has a similar current throughout the range of 0.2 to 2.5 Ω·cm of the resistivity of the P-type silicon single crystal substrate, the back surface electrode pitch is 0.1 mm or more and 10 mm or less, a total area of contact areas of the back surface electrodes is in a range of from about 5 to 20%, on the basis of the whole area of the backside, and a conversion efficiency of the solar cell is about 20%.

20. A solar cell comprising:
(i) a P-type silicon single crystal substrate doped with gallium and having a resistivity of 0.2 to 2.5 Ω·cm in which one main surface is a light-receiving surface and the other main surface is a backside, the P-type silicon single crystal substrate being produced from an ingot grown by a Czochralski method;
(ii) a backside electrode comprising a plurality of back surface electrodes in electrical contact with the P-type silicon single crystal substrate in a plurality of contact areas; wherein the contact areas have a pitch $P_{rm}$ [mm] of 0.1 to 10 mm, and the pitch $P_{rm}$ [mm] further has a value such that, with the proviso that the pitch is in a horizontal axis of a diagram shown by $R_{sub}$ versus $P_{rm}$ and the resistivity of the P-type silicon single crystal substrate is in a vertical axis of the diagram, a variation in a short-circuit current density of the solar cell is smaller as compared to a variation in the resistivity of the P-type silicon single crystal substrate, the short-circuit current density is within a value defined by the lines of 0.2 Ω·cm and 2.5 Ω·cm and the line of log $(R_{sub})=-$log $(P_{rm})+1.0$, and the solar cell shows a similar current throughout the range of 0.2 to 2.5 Ω·cm of the resistivity of the P-type silicon single crystal substrate;
(iii) an N-type layer formed on at least a part of the light-receiving surface;
(iv) a back surface passivation layer formed on the whole of the backside;
(v) a light-receiving surface passivation layer; and
(vi) a light-receiving surface electrode in electrical contact with the N-type layer, wherein the pitch $P_{rm}$ [mm] of the contact areas and the resistivity $R_{sub}$ [Ω·cm] satisfy the relationship represented by the following formula (1)

$$\log(R_{sub}) \leq -\log(P_{rm}) + 1.0 \quad (1),$$

wherein a total area of the contact areas of the back surface electrodes is in a range of from about 5 to 20%, on the basis of the whole area of the backside, and wherein a conversion efficiency of the solar cell is about 20%.

21. The solar cell according to claim 18, wherein with the proviso that the pitch $P_{rm}$ [mm] is in the horizontal axis of the diagram and the resistivity $R_{sub}$ [Ω·cm] of the P-type silicon substrate is in the vertical axis of the diagram, the short-circuit current density is about 38 mA/cm' when the pitch is 1 mm and the resistivity is 0.2 Ω·cm, and the short-circuit current density is about 39 mA/cm² when the pitch is 1 mm and the resistivity is 2.5 Ω·cm.

22. The solar cell according to claim 19, wherein with the proviso that the pitch $P_{rm}$ [mm] is in the horizontal axis of the diagram and the resistivity $R_{sub}$ [Ω·cm] of the P-type silicon substrate is in the vertical axis of the diagram, the short-circuit current density is about 38 mA/cm² when the pitch is 1 mm and the resistivity is 0.2 Ω·cm, and the short-circuit current density is about 39 mA/cm² when the pitch is 1 mm and the resistivity is 2.5 Ω·cm.

23. The solar cell according to claim 20, wherein with the proviso that the pitch $P_{rm}$ [mm] is in the horizontal axis of the diagram and the resistivity $R_{sub}$ [Ω·cm] of the P-type silicon substrate is in the vertical axis of the diagram, the short-circuit current density is about 38 mA/cm² when the pitch is 1 mm and the resistivity is 0.2 Ω·cm, and the short-circuit current density is about 39 mA/cm² when the pitch is 1 mm and the resistivity is 2.5 Ω·cm.

24. A solar cell module comprising a plurality of the solar cells according to claim 18, which are connected in series.

25. A solar cell module comprising a plurality of the solar cells according to claim 19, which are connected in series.

26. A solar cell module comprising a plurality of the solar cells according to claim 20, which are connected in series.

27. A solar cell module comprising a plurality of the solar cells according to claim 21, which are connected in series.

28. A solar cell module comprising a plurality of the solar cells according to claim 22, which are connected in series.

29. A solar cell module comprising a plurality of the solar cells according to claim 23, which are connected in series.

30. A solar cell comprising:
    a P-type silicon substrate in which one main surface is a light-receiving surface and the other main surface is a backside, wherein:
        the P-type silicon substrate is a silicon single crystal substrate doped with gallium and is produced from an ingot grown by a Czochralski method, and
        the P-type silicon substrate has a resistivity in a range of 0.2 to 2.5 Ω·cm;
    an N-type layer on at least a part of the light-receiving surface of the P-type silicon substrate;
    a surface passivation layer on the backside of the P-type silicon substrate;
    a first electrode on the light-receiving surface; and
    a second electrode comprising a plurality of back surface electrodes on the backside of the P-type silicon substrate;
    wherein:
        the plurality of back surface electrodes penetrate through the surface passivation layer to contact the P-type silicon substrate in a plurality of contact areas which are provided in a plurality of regular patterns provided with a regular pitch;
        a value of the regular pitch is such that a short-circuit current density of the solar cell shows a smaller variation as compared to the resistivity of the P-type silicon substrate, and the solar cell has a similar current throughout the range of the resistivity of 0.2 to 2.5 Ω·cm of the P-type silicon substrate;
        the total area of the plurality of contact areas of the back surface electrodes is about 5% or more and 20% or less on the basis of the whole of the backside; and
    a conversion efficiency of the solar cell is about 20%.

31. A solar cell module comprising a plurality of the solar cells according to claim 30, connected in series by using an inter connecter.

* * * * *